United States Patent
Urasaki et al.

(10) Patent No.: US 6,281,450 B1
(45) Date of Patent: Aug. 28, 2001

(54) SUBSTRATE FOR MOUNTING SEMICONDUCTOR CHIPS

(75) Inventors: Naoyuki Urasaki; Yasusi Simada, both of Tsukuba; Yoshiyuki Tsuru, Shimodate; Akishi Nakaso, Oyama; Itsuo Watanabe, Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/446,674
(22) PCT Filed: Jun. 26, 1998
(86) PCT No.: PCT/JP98/02872
  § 371 Date: Dec. 27, 1999
  § 102(e) Date: Dec. 27, 1999
(87) PCT Pub. No.: WO99/00842
  PCT Pub. Date: Jan. 7, 1999

(30) Foreign Application Priority Data

Jun. 26, 1997 (JP) .................................................. 9-169339
Jun. 26, 1997 (JP) .................................................. 9-169340
Jun. 26, 1997 (JP) .................................................. 9-169341

(51) Int. Cl.⁷ ............................... H01R 9/09; H05K 7/10
(52) U.S. Cl. .................. 174/261; 174/260; 174/258; 361/767; 361/771; 257/737; 257/777
(58) Field of Search .................. 174/261, 260, 174/258, 255, 52.2, 52.3, 52.4; 361/767, 768, 769, 770, 771, 783; 257/777, 787, 737, 778, 723; 438/108, 126

(56) References Cited

U.S. PATENT DOCUMENTS

| | | | |
|---|---|---|---|
| 4,202,007 | * | 5/1980 | Dougherty et al. ............... 257/697 |
| 5,065,227 | * | 11/1991 | Frankeney et al. ............... 257/778 |
| 5,068,714 | * | 11/1991 | Seipler ............................ 257/703 |
| 5,225,966 | * | 7/1993 | Basavanhally et al. ............. 361/774 |
| 5,237,130 | * | 8/1993 | Kulesza et al. ..................... 174/260 |
| 5,253,010 | | 10/1993 | Oku et al. . |
| 5,258,577 | * | 11/1993 | Clements ........................... 174/88 R |
| 5,378,859 | * | 1/1995 | Shirasaki et al. .................. 174/261 |
| 5,397,864 | * | 3/1995 | Rai et al. ........................... 174/261 |
| 5,436,503 | * | 7/1995 | Kunitomo et al. .................. 257/737 |
| 5,483,421 | * | 1/1996 | Gedney et al. ..................... 361/771 |
| 5,535,101 | * | 7/1996 | Miles et al. ......................... 361/808 |
| 5,586,007 | * | 12/1996 | Funada ............................... 361/720 |
| 5,615,477 | | 4/1997 | Sweitzer . |
| 5,641,996 | * | 6/1997 | Omoya et al. ....................... 257/787 |
| 5,650,595 | * | 7/1997 | Bentlage et al. .................... 174/260 |
| 5,710,071 | * | 1/1998 | Beddingfield et al. ............. 438/108 |
| 5,714,252 | * | 2/1998 | Hogerton et al. ................... 428/344 |
| 5,726,489 | * | 3/1998 | Matsuda et al. .................... 257/659 |
| 5,804,882 | * | 9/1998 | Tsukagohsi et al. ................ 257/783 |

(List continued on next page.)

FOREIGN PATENT DOCUMENTS

| | | |
|---|---|---|
| 0 493 131 | 7/1992 | (EP) . |
| 0 682 369 | 10/1995 | (EP) . |
| 0 720 419 | 7/1996 | (EP) . |
| 58-148434 | 3/1983 | (JP) . |
| 59-156904 U | 9/1984 | (JP) . |
| 60-84844 | 5/1985 | (JP) . |
| 60-180189 | 9/1985 | (JP) . |
| 62-6652 | 2/1987 | (JP) . |
| 60-41859 | 2/1994 | (JP) . |

Primary Examiner—Albert W. Paladini
Assistant Examiner—I B Patel
(74) Attorney, Agent, or Firm—Antonelli, Terry, Stout & Kraus, LLP (57) ABSTRACT

A substrate for mounting a semiconductor chip having bumps using an adhesive thereon, said substrate being, for instance, provided with an insulating coating having an opening in the semiconductor chip mounting area so that the wiring conductors will not be exposed to the substrate surface near the boundary of the semiconductor chip mounting area, is improved in connection reliability and has high mass productivity.

9 Claims, 9 Drawing Sheets

U.S. PATENT DOCUMENTS

| | | | |
|---|---|---|---|
| 5,870,289 | * | 2/1999 | Tokuda et al. ......................... 361/779 |
| 5,920,123 | * | 7/1999 | Moden ................................. 257/774 |
| 5,925,445 | * | 7/1999 | Suzuki ................................. 428/209 |
| 5,949,142 | * | 9/1999 | Otsuka ................................ 257/737 |
| 6,049,122 | * | 4/2000 | Yoneda ............................... 257/668 |
| 6,061,248 | * | 5/2000 | Otani et al. .......................... 361/777 |
| 6,071,755 | * | 6/2000 | Baba et al. ........................... 438/106 |
| 6,078,505 | * | 6/2000 | Turudic ............................... 361/760 |
| 6,097,610 | * | 8/2000 | Hashimoto .......................... 361/760 |
| 6,108,210 | * | 8/2000 | Chung ................................. 361/747 |
| 6,140,707 | * | 10/2000 | Plepys et al. ........................ 257/778 |

* cited by examiner

SUBSTRATE FOR MOUNTING SEMICONDUCTOR CHIPS

TECHINICAL FIELD

The present invention relates to a substrate for mounting a semiconductor chip.

BACKGROUND ART

With advance of electronic devices in recent years, request for reduction in size and weight of the circuit-boards consisting of a wiring board and related electronic arts, not to speak of demand for higher performance of electronic devices, has become more and more intense. Hitherto, the packaging technology has evolved from the system in which DIP or PGA packages were mounted on a wiring board having through-holes to the system in which QFP or BGA packages are mounted on a wiring board having connecting circuits on the surface. Such evolution is credited to the realization of high-density packaging owing to the reduced dead space of the wiring board and facilitation of miniaturization and higher performance of the packages themselves. However, there is no end to the progress of electronic devices, and compatibilization of the request for higher performance of electronic devices and the request for reduction in size and weight of circuit-boards is still a serious thesis.

As a solution to the above problem, attention is focused on the method in which the semiconductor chips are not packaged but directly mounted on a wiring board. This method is roughly divided into two patterns according to the way in which the semiconductor chips and wiring board are joined.

In one pattern of the method, there is used the technique of wire bonding which has been generally employed in the art of packaging. Another pattern of the method comprises bump bonding. The latter technique is generally called flip chip bonding. This method is expected to pervade in the future as this technique facilitates multi-pin assembly since the electrodes can be formed in the mode of area array, and also as this bonding has good electrical properties because of short signal path.

According to the ordinary flip chip bonding method, a semiconductor chip and a substrate are electrically connected by means of reflowing, making use of the solder bumps provided on the metallic terminals having wettability of the semiconductor chip and the metallic terminals having wettability disposed on the pairing substrate.

To date, several proposals have been made on the mass productivity-improving structures of the substrate for mounting such a semiconductor chip, but all these proposals have merits and demerits, and there still is the thesis that a structure with high mass productivity is yet to be established.

DISCLOSURE OF INVENTION

The present invention aims at providing a substrate for mounting a semiconductor chip (which may hereinafter be called semiconductor chip mounting substrate) which is improved in connection reliability and also has high mass productivity.

The present invention provides a semiconductor chip mounting substrate designed to mount a semiconductor chip having the bumps with an adhesive, characterized in that at least the connecting terminals for making connection to the bumps of the semiconductor chip are provided in the area of the substrate surface where a semiconductor chip is to be mounted, and the wiring conductors are provided outside the area where a semiconductor chip is to be mounted, said wiring conductors being so disposed that they will not be exposed to the substrate surface near the boundary of the area where a semiconductor chip is to be mounted.

BEST MODE FOR CARRYING OUT THE INVENTION

The semiconductor chip mounting substrate of the present invention is a substrate for mounting a semiconductor chip having the bumps with an adhesive, characterized in that at least the connecting terminals for making connection to the bumps of the semiconductor chip are provided in the area of the substrate surface where a semiconductor chip is to be mounted, and the wiring conductors are provided outside the area where a semiconductor chip is to be mounted, said wiring conductors being so disposed that they will not be exposed to the substrate surface near the boundary of the area where a semiconductor chip is to be mounted.

Figure 1A:
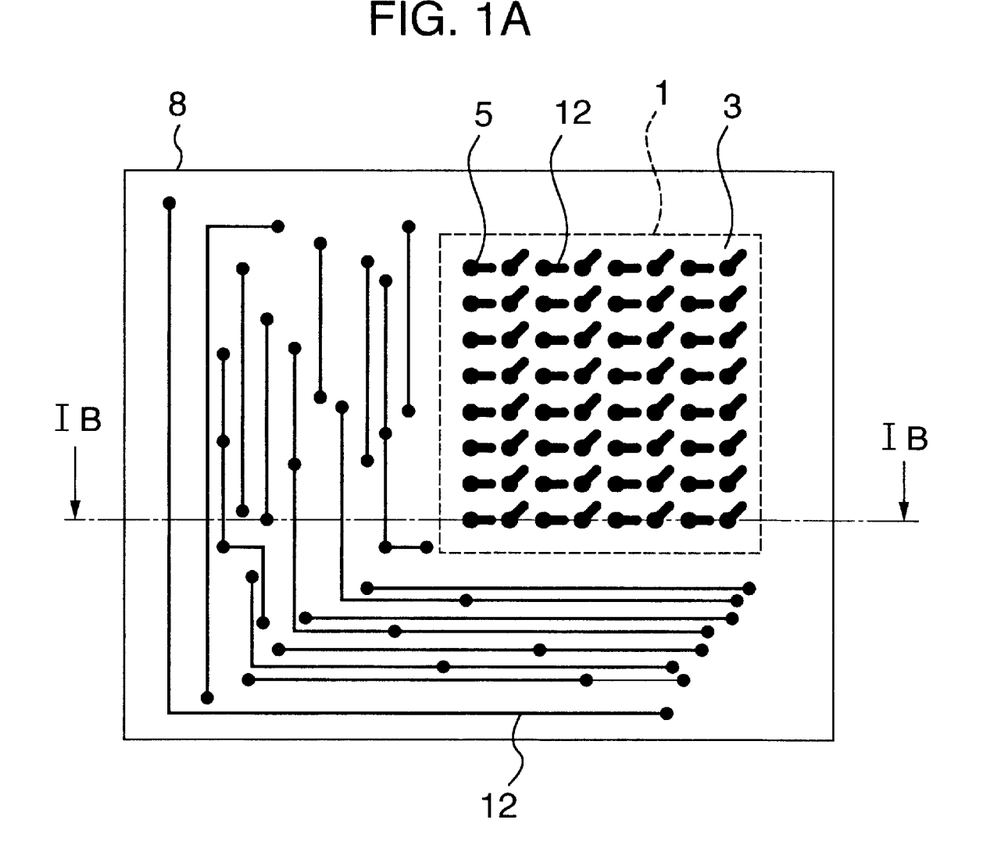
FIG. 1A is a top view showing an embodiment of the present invention.
Figure 1B:
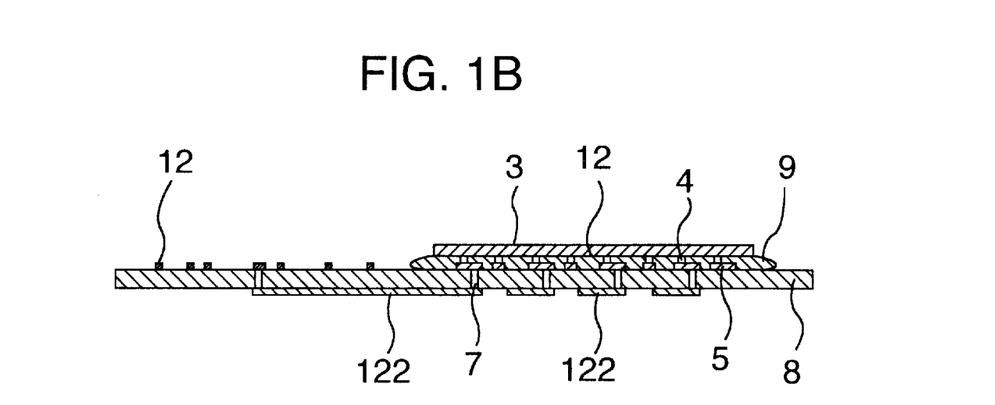
FIG. 1B is a sectional view taken along the line 1B—1B of FIG. 1A.

The semiconductor chip mounting substrate of the present invention, as shown in FIGS. 1A and 1B, is a substrate 8 for mounting a semiconductor chip 3 having bumps 4, characterized in that at least the connecting terminals 5 for making connection to the bumps 4 of the semiconductor chip 3 are provided in the area of the substrate surface where the semiconductor chip is to be mounted, and the wiring conductors 12 are provided outside the area where the semiconductor chip is to be mounted, said wiring conductors 12 being so disposed that they will not be exposed to the substrate surface near the boundary 1 of the area where the semiconductor chip is to be mounted.

One means for disposing the wiring conductors 12 so that they will not be exposed to the substrate surface near the boundary 1 of the semiconductor chip mounting area is not to provide any wiring conductor 12 in the surface of the substrate near the boundary 1 of the area where a semiconductor chip is to be mounted. In this case, it is only required that the wiring conductors 12 led out from the respective connecting terminals 5 be connected to the corresponding wiring conductors 122 of another conductor layer through the via-holes (not shown) or through-holes 7.

The zone where no wiring conductor 12 is to be disposed is preferably at least 100 μm away both inwardly and outwardly from the boundary 1 (contour of the semiconductor chip) of the semiconductor chip mounting area. If the distance from the conductor-free zone to the boundary 1 is less than 100 μm, there is a possibility that the edge of the semiconductor chip 3 be short-circuited with wiring conductors 12 in the mounting operation.

Figure 2A:
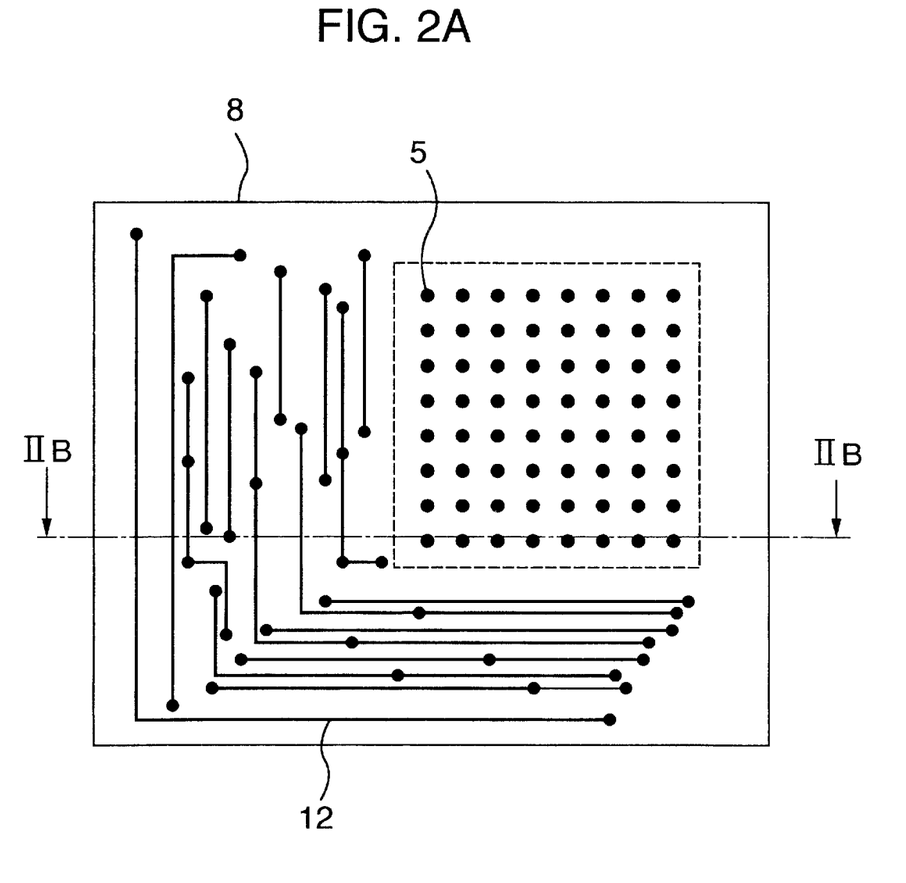
FIG. 2A is a top view showing another embodiment of the present invention.
Figure 2B:
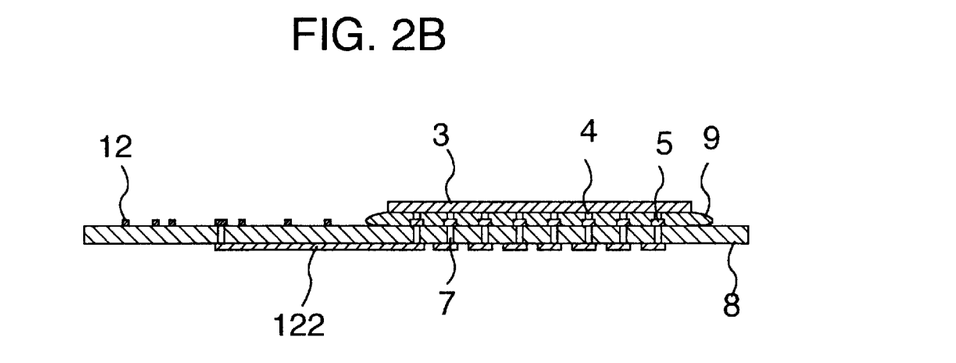
FIG. 2B is a sectional view taken along the line IIB—IIB of FIG. 2A.

The area where the semiconductor chip is to be mounted may be designed such that the connecting terminals 5 are provided only for the purpose of making connection to the bumps 4 of the semiconductor chip 3 as shown in FIGS. 2A and 2B. In this case, the connecting terminals 5 may be directly connected to the corresponding wiring conductors 122 of another conductor layer through the via-holes (not shown) or through-holes 7.

Further, this semiconductor chip mounting substrate may be a semiconductor package (multi-chip module) for mounting a plural number of semiconductor chips. For instance, it may be a plastic leadless chip carrier (hereinafter referred to as PLCC) which is a wiring board comprising the connecting terminals, an insulating layer supporting said terminals, the conductors on the rear side connected to said connecting terminals, and the through-holes connecting said connecting terminals and said conductors on the rear side, said conductors being connected to the half-split through-holes formed at the end of the substrate.

Also, the substrate of the present invention may be a semiconductor package having the pads with an array interval wider than the array interval of the connecting terminals, which pads are formed on the rear side of the substrate instead of the half-split through-holes formed at the end of the substrate. This package may be used as a ball grid array (hereinafter referred to as BGA) by mounting solder balls on the pads or as a flip chip by forming the solder or gold bumps.

The substrate of the present invention can be also designed to be used as PLCC comprising the connecting terminals, an insulating layer for supporting said terminals, the inner layer conductors connected to said connecting terminals, and the via-holes connecting said connecting terminals and inner layer conductors, said inner layer conductors being connected to the half-split through-holes formed at the end of the substrate.

These structures, however, necessitate the through-holes or via-holes as explained above and also require the wiring conductors of another conductor layer to be connected thereto, which necessarily raises the wiring density of the part other than the semiconductor chip mounted area, making the fabrication difficult and raising the manufacturing cost. As the second means for disposing the wiring conductors 12 without being exposed to the surface at the zone near the boundary 1 of the area where the semiconductor chip is to be mounted, the following method is available. The wiring conductors are led out from the respective connecting terminals and provided beyond the boundary of the area where the semiconductor chip is to be mounted, while the insulating coating of said wiring conductors is formed outside of the area where the semiconductor chip is to be mounted, and in order that the wiring conductors may not be exposed to the surface near the boundary of the semiconductor chip mounting area, the surface of the semiconductor chip mounting substrate near the boundary of the semiconductor chip mounting area is coated with an adhesive for fixing the semiconductor chip.

Alternatively, the wiring conductors are led out from the connecting terminals and stretched beyond the boundary of the area where the semiconductor chip is to be mounted, and in order that the wiring conductors may not be exposed near the boundary of the semiconductor chip mounting area, the insulating coating of said wiring conductors is provided in such a manner that it will cover not only the wiring conductors near the boundary of the semiconductor chip mounting area but also the outside of said area.

Figure 3A:
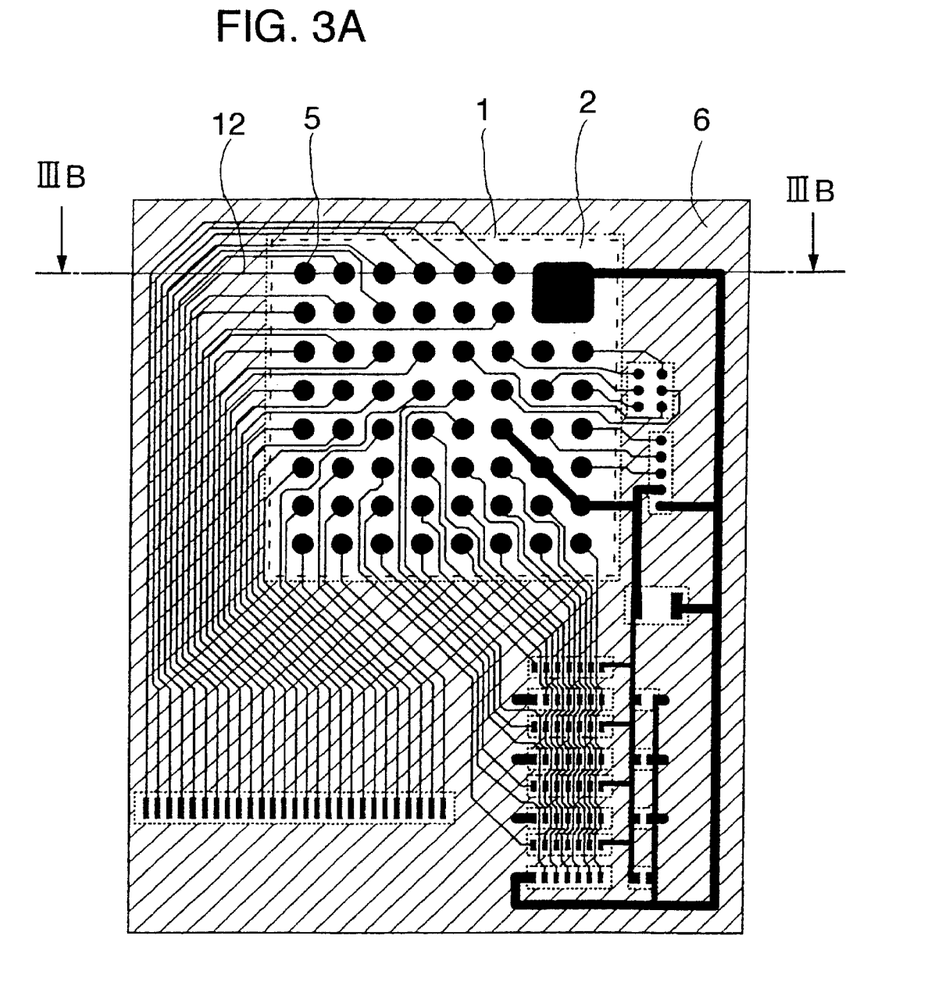
FIG. 3A is a top view showing still another embodiment of the present invention.
Figure 3B:
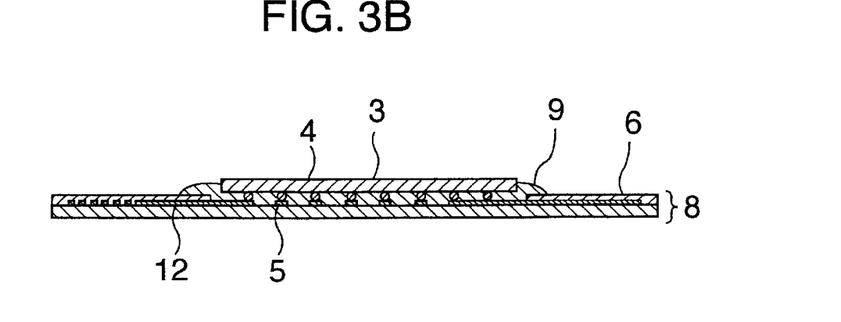
FIG. 3B is a sectional view taken along the line IIIB1—IIIB of FIG. 3B.

The second means according to the present invention can cope with the situation where the above-said measures can not be taken because of miniaturization of the semiconductor chip mounting substrate, and instead, the wiring conductors extended out from the connecting terminals must be provided beyond the boundary of the area where the semiconductor chip is to be mounted. That is, according to the second means for disposing the wiring conductors 12 without being exposed near the boundary 1 of the semiconductor chip mounting area, as shown in FIGS. 3A and 3B, the insulating coating 6 of the wiring conductors 12 is formed outside of the semiconductor chip mounting area, and the surface of the semiconductor mounting substrate near the boundary 1 of said area is coated with an adhesive for fixing the semiconductor chip.

The boundary 2 of this insulating coating is preferably within the range of up to 300 μm outwardly from the boundary 1 of the semiconductor chip mounting area. If this boundary-to-boundary distance exceeds 300 μm, the wiring conductors 12 may not be completely covered with the adhesive 9, causing a reduction of insulation reliability.

The materials ordinarily used for solder resists are preferably employed for said insulating coating 6. Such a coating can also be formed by silk screen printing or by pasting a film- or sheet-like insulating material.

Especially, solder resist ink is low in material cost and suited for forming the coating in large volumes. The thickness of this insulating coating 6 is preferably 15 to 50 μm. When the coating thickness is less than 15 μm, it becomes difficult to form a uniform insulating film, and when the thickness exceeds 50 μm, although insulation reliability is enhanced, it becomes necessary to conduct a plural number of times of resin coating operation for forming a build-up exceeding 50 μm, resulting in a reduced productivity and an elevated production cost.

Figure 4A:
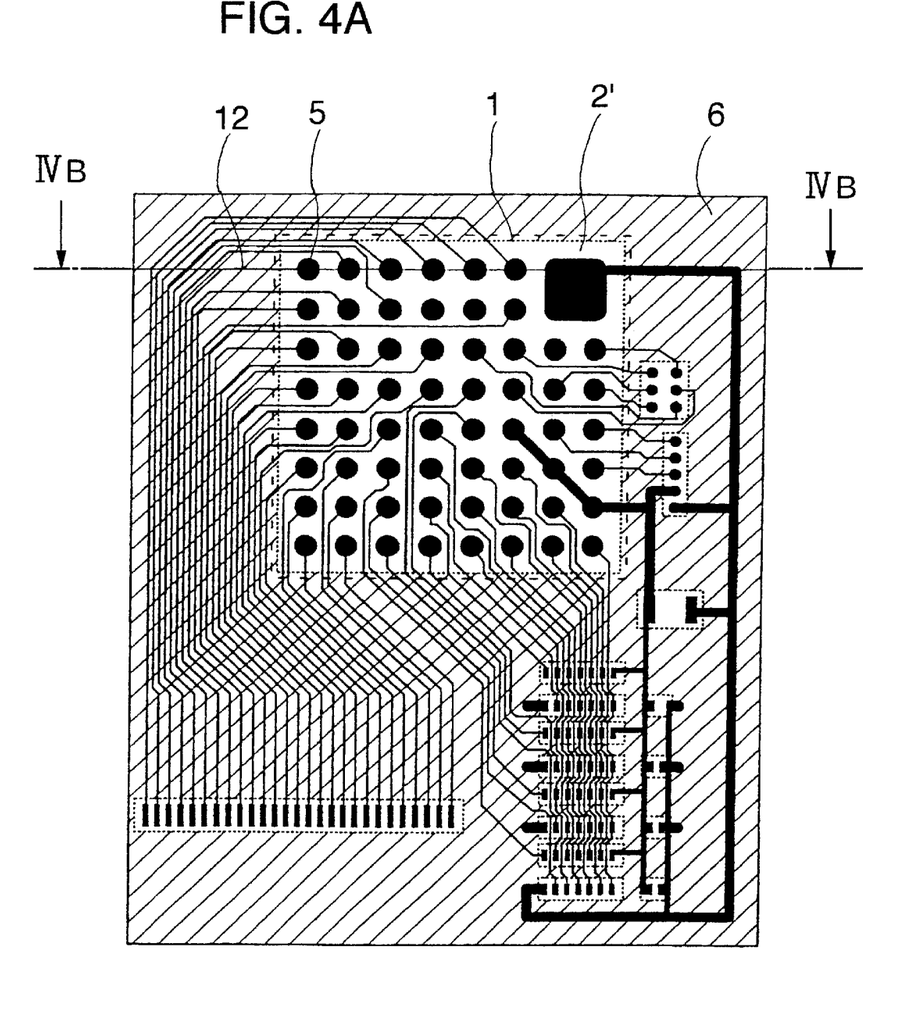
FIG. 4A is a top view showing yet another embodiment of the present invention.
Figure 4B:
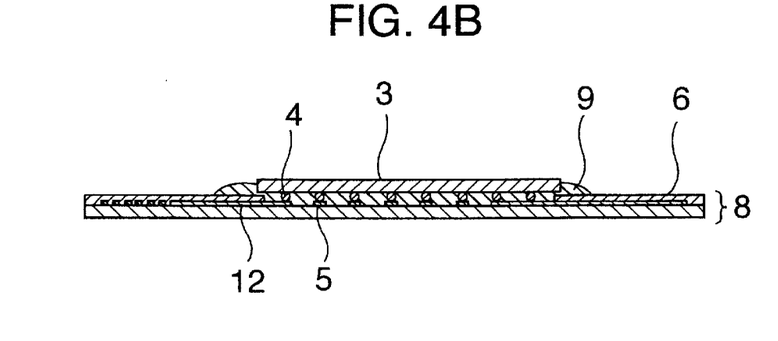
FIG. 4B is a sectional view taken along the line IVB—IVB of FIG. 4A.

Further, in some cases, because of high-density wiring, the wiring conductors need to be laid to a point close to the area where the semiconductor chip is to be mounted. In such a case, it is preferable that, as shown in FIGS. 4A and 4B, the insulating coating be applied to the range 2' narrower than the boundary 1 of the semiconductor chip mounting area, and that the insulating coating 6 of the wiring conductors 12 not only covers the wiring conductors 12 staying at the boundary 1 of the semiconductor chip mounting area but is also formed outside of said area.

In this case, it is preferable that the insulating coating 6 be formed to a point 20 to 300 μm inwards from the boundary 1 of the semiconductor chip mounting area. If the inward coating distance is less than 20 μm, the area where the wiring remains uncoated may be positioned just beneath the outer periphery of the semiconductor chip due to positional shift of the solder resist, and this may cause short-circuiting during packaging. If said coating distance exceeds 300 µm, insulating coating may be formed to a point close to the connecting terminals 5, which may cause a reduction of connection reliability because of surface contamination of the connecting terminals 5 and other ill effects.

The thickness of the insulating coating 6 in these cases is preferably so set that when a semiconductor chip 3 is mounted after positioning on its substrate 8 without giving pressure, a clearance will be formed infallibly between the semiconductor chip 3 and the insulating coating 6. When the semiconductor chip 3 is connected to its substrate 8 by heating under pressure, the adhesive 9 is allowed to flow out from the clearance, so that no pressure is exerted to the other parts and hence no stress remains, minimizing the risk of deformation after connection.

Thus, the insulating coating 6 functions to check most of the adhesive 9 from flowing out while allowing part of the adhesive to flow out to the outside from the boundary of the insulating coating. Therefore, no pressure is exerted to the other parts and no stress remains, resulting in a minimized risk of deformation after connection. Further, the space between the wiring conductors 12 present in the semiconductor chip mounting area and its vicinity and the rear side of the semiconductor chip is shut off from the air to protect the elements. The similar effect can be obtained by, for instance, incorporating the first means for inhibiting the wiring conductors 12 from being exposed to the surface near the boundary 1 of the semiconductor chip mounting area as illustrated in FIGS. 5A and 5B or FIGS. 6A and 6B.

Said connecting terminals 5 are preferably supported by a glass-cloth reinforced substrate. The semiconductor chip mounting substrate by which these connecting terminals are supported is a glass-cloth reinforced substrate having a build-up layer formed thereon, with the connecting terminals 5 being preferably supported directly by such a build-up layer. This build-up layer may be an insulating layer reinforced with nonwoven glass fabric or aramide fiber.

As the resin composition used as the adhesive for bonding the semiconductor chip mounting substrate and a semiconductor chip having bumps according to the present invention, there is used a mixture of an epoxy resin and a potential curing agent such as, for example, imidazole- or hydrazide-based curing agents, boron trifluoride-amine complex, sulfoniumsalts, amine-imides, polyamine salts, and dicyanediamides. For mitigating the stress resulting from the difference in thermal expansion coefficient between the circuitries, an adhesive resin composition having a storage elastic modulus of 100 to 1,500 MPa as measured at 40° C. after bonding is preferably used.

For example, as the resin compositions of the adhesives capable of providing good fluidity at the connecting work and high connection reliability, there can be mentioned the adhesives prepared by blending an acrylic rubber in the mixtures of epoxy resins and potential curing agents such as imidazole- or hydrazide-based curing agents, boron trifluoride-amine complex, sulfonium salts, amine-imides, polyamine salts, and dicyanediamides so that the adhesives will have a storage elastic modulus of 100 to 1,500 MPa at 40° C. after adhesion.

Storage elastic modulus of the cured products of the adhesive films obtained by dissolving these resin compositions in a solvent, applying the solution on a film or sheet which has been subjected to a surface releasing treatment, and heating the film or sheet to a temperature below the curing temperature of the curing agent to evaporate the solvent, can be measured by using, for instance, Rheospectra DVE-4 (tensile mode, frequency: 10 Hz, heated at a rate of 5° C./min) mfd. by Rheology Co., Ltd.

As the acrylic rubber blended in the adhesives, the polymers or copolymers containing at least one of acrylic acid, acrylic esters, methacrylic esters and acrylonitrile as a monomer component can be cited. Especially, the copolymeric acrylic rubbers containing a glycidyl acrylate or glycidyl methacrylate having glycidyl ether groups are preferably used.

The molecular weight of these acrylic rubbers is preferably not less than 200,000 for maximizing the cohesive force of the adhesive. As for the content of the acrylic rubber in the adhesive, the fact is to be noted that when the content is less than 15% by weight, storage elastic modulus of the adhesive at 40° C. after adhesion exceeds 1,500 MPa, and when the content is higher than 40% by weight, although elastic modulus of the adhesive can be lowered, its melt viscosity at the time of connection elevates to reduce removability of the molten adhesive at the interface of the connecting electrodes or at the interface between the connecting electrodes and the conductive particles, making it unable to secure electrical conduction between the connecting electrodes or between the connecting electrodes and the conductive particles. Thus, the preferred content of acrylic rubber is 15 to 40% by weight.

In order to improve the film forming properties, a thermoplastic resin such as phenoxy resins may be blended in the adhesive. Phenoxy resins are preferred because of good compatibility with and adhesiveness to epoxy resins as they have a similar molecular structure.

For forming such an adhesive into a film, an adhesive composition comprising an epoxy resin, an acrylic rubber, a phenoxy resin and a potential curing agent such as mentioned above is dissolved or dispersed in an organic solvent to form a solution, then this solution is applied on a releasable substrate, and the solvent is removed by heating to a temperature below the active temperature of the curing agent. The solvent used in this process is preferably a mixture of an aromatic hydrocarbon type solvent and an oxygenated solvent for improving solubility of the materials in the solvent.

In order to accommodate variation in height of the semiconductor chip bumps and the circuit electrodes, the conductive particles may be dispersed in the adhesive for the purpose of positively affording anisotropic conductivity to the adhesive.

Such conductive particles can be the particles of a metal such as Au, Ni, Ag, Cu, W or solder, or the coated metal particles obtained by forming a thin film of a metal such as gold or palladium on the surfaces of said metal particles. It is also possible to use the conductive particles produced by providing a conductive layer of Ni, Cu, Au, solder or the like on the spherical nucleus material of a polymer such as polystyrene.

The particle size needs to be smaller than the minimal interval of the electrodes on the substrate, and in case there is scatter in height of the electrodes, it is desirable that the particle size exceeds limits of such scatter, preferably falling in the range of 1 to 10 µm.

The content of the conductive particles dispersed in the adhesive is 0.1 to 30%, preferably 0.1 to 20% by volume.

A commercially available product of such an anisotropic conductive adhesive is Flip Tac (trade name, produced by Hitachi Chemical Company, Ltd.).

The resin used for filling the through-holes is preferably a resin composition consisting of a polyamide-imide resin and a thermosetting component.

As the polyamide-imide resin, it is preferable to use an aromatic polyamide-imide resin obtained by reacting an aromatic diimidocarboxylic acid—which has been obtained by reacting a diamine having three or more aromatic rings with a trimellitic anhydride—with an aromatic diisocyanate, or an aromatic polyamide-imide resin obtained by reacting 2,2-bis[4-{4-(5-hydroxycarbonyl-1,3-dione-isoindolino)phenyl}propane as an aromatic diimidocarboxylic acid with 4,4'-diphenylmethanediisocyanate as an aromatic diisocyanate.

As the diamine having three or more aromatic rings, 2,2-bis[4-(4-aminophenoxy)phenyl]propane, bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene and the like can be used either singly or in combination.

As the aromatic diisocyanate, 4,4'-diphenylmethane diisocyanate, 2,4-tolylene diisocyanate, 2,6-tolylene diisocyanate, naphthalene-1,5-diisocyanate, 2,4-tolylene dimer and the like can be used either singly or in combination.

The thermosetting component is preferably an epoxy resin and its curing agent or a curing accelerator. Any epoxy resin having 2 or more glycidyl groups, preferably 3 or more glycidyl groups, can be used. The epoxy resin may be liquid or solid at room temperature. The commercially available epoxy resins, in liquid form, include YD128, YD8125, etc. (trade names, produced by Tohto Kasei Co., Ltd.), Ep815, Ep828, etc. (trade names, produced by Yuka Shell Epoxy Co., Ltd.), and DER337, etc. (trade name, produced by the Dow Chemical Co.), which are bisphenol A type, and YDF170, YDF2004, etc. (trade names, produced by Tohto Kasei Co., Ltd.) which are bisphenol F type. The commercially available solid epoxy resins include YD907, YDCN704S, YDPN172, etc. (trade names, produced by Tohto Kasei Co., Ltd.), Ep1001, Ep1010, Ep180S70, etc. (trade names, produced by Yuka Shell Epoxy Co., Ltd.), ESA019, ESCN195, etc. (trade names, produced by Sumitomo Chemical Company, Ltd.), DER667, DESN195, etc. (trade names, produced the Dow Chemical Co.) and EOCN1020, etc. (trade name, produced by Nippon Kayaku Co., Ltd.).

A brominated epoxy resin may be used for improving flame retardancy. For example, as commercial products thereof, YDB400, etc. (trade name, produced by Tohto Kasei Co., Ltd.), Ep5050, etc. (trade name, produced by Yuka Shell Epoxy Co., Ltd.) and ESB400, etc. (trade name, produced by Sumitomo Chemical Company, Ltd.) can be mentioned.

These epoxy resins may be used singly, or a plural number of such epoxy resins may be selected as required.

As the epoxy resin curing agent or curing accelerator, amines, imidazoles, polyfunctional phenols, acid anhydrides, isocyanates and the like can be used.

Amines include dicyandiamide, diaminodiphenylmethane and guanylurea. Imidazoles include alkyl-substituted imidazole and benzimidazole. Polyfunctional phenols include hydroquinone, resolcinol, bisphenol A and its halogen compounds, novolak which is a condensate of bisphenol A and aldehyde, and resol resins. Acid anhydrides include phthalic anhydride, hexahydro-phthalic anhydride, and benzophenonetetracarboxylic acid. Isocyanates include tolylene diisocyanate and isophorone diisocyanate. These isocyanates may be masked with phenols.

The necessary amount of the curing agent is as follows. In the case of an amine, its amount is preferably such that the equivalent amount of active hydrogen of the amine and the epoxy equivalent of the epoxy resin will become substantially equal to each other. For instance, in the case of a primary amine, there are two hydrogen atoms, and there is required 0.5 equivalent of this primary amine to one equivalent of the epoxy resin. In the case of a secondary amine, one equivalent of this amine is required to one equivalent of the epoxy resin.

In the case of an imidazole, its amount can not be simply defined in terms of equivalent ratio to active hydrogen; empirically, there is required 1 to 10 parts by weight of an imidazole per 100 parts by weight of the epoxy resin.

In the case of an isocyanate, as it reacts with either of polyamide-imide resins and epoxy resins, there is required 0.8 to 1.2 equivalents of an isocyanate to one equivalent of either of these resins. It is possible to use a single curing agent or curing accelerator, but it is also possible to select a plural number of curing agents or curing accelerators as required.

As for the ratio by weight of the thermosetting component to the polyamide-imide resin, the ratio of the thermosetting component is preferably in the range of 10 to 150 parts by weight per 100 parts by weight of the polyamide-imide resin. When this ratio is less than 10 parts by weight, there directly comes out the peculiarity of the polyamide resins that the linear expansion coefficient at temperatures from glass transition point to 350° C. is large and the storage elastic modulus at 300° C. is low. When said ratio exceeds 150 parts by weight, compatibility of the two lowers, causing gelation in the course of stirring.

The present invention will be explained in further detail by showing the examples thereof.

EXAMPLE 1

Figure 5A:
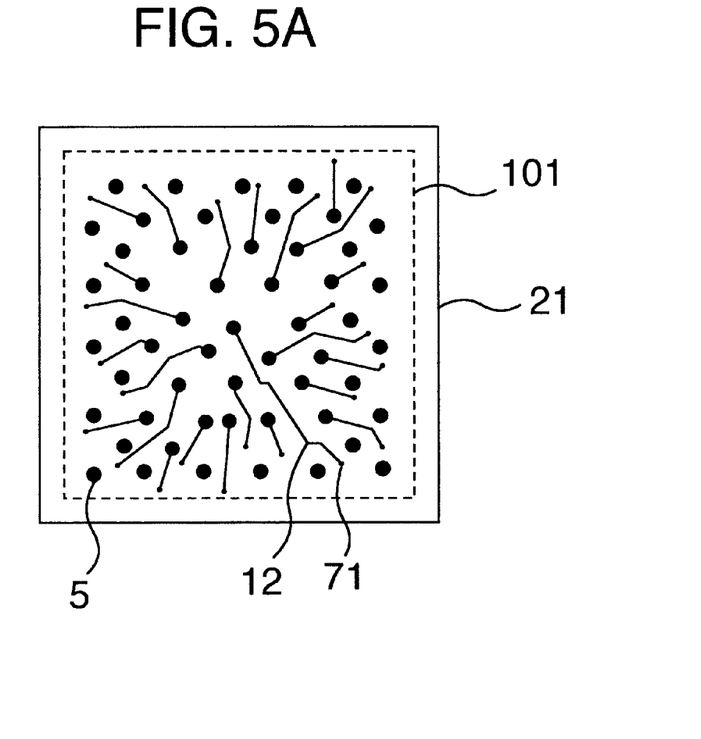
FIG. 5A is a top view showing the principal part of Example 1 of the present invention.
Figure 5B:
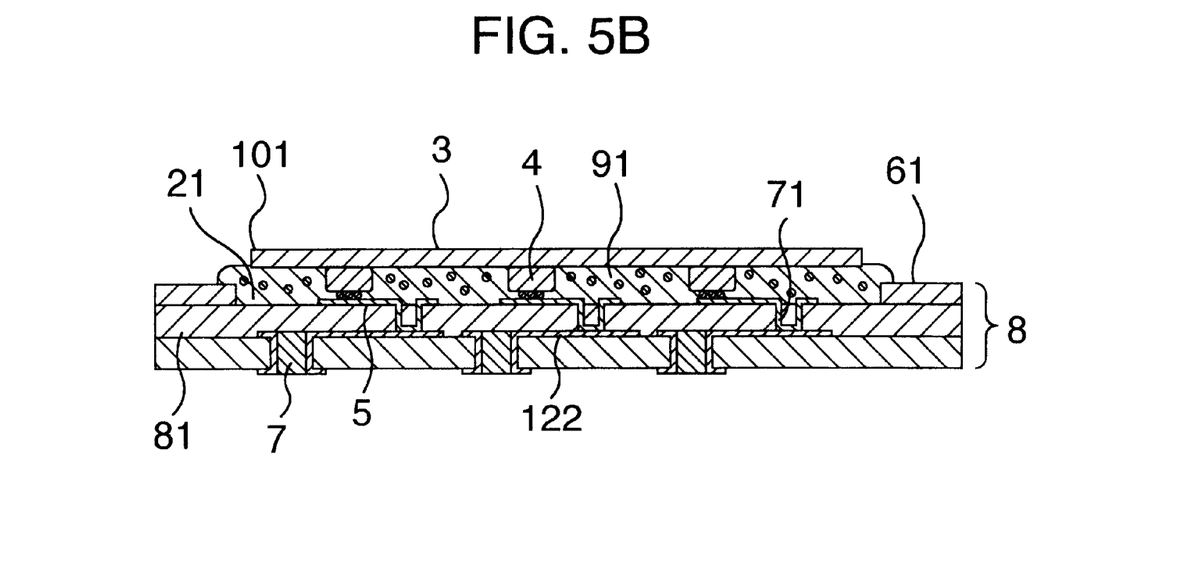
FIG. 5B is a sectional view of Example 1 of the present invention.

A 0.8 mm thick both-sided copper-clad laminate MCL-E-67 (trade name, produced by Hitachi Chemical Company, Ltd.) having an 18 $\mu$m copper foil on both sides thereof, serving as a support in a substrate, was perforated to form the holes that were to become through-holes 7 in FIG. 5B, and immersed in an electroless copper plating solution L-59 (trade name, produced by Hitachi Chemical Company, Ltd.) at 70° C. for 8 hours, causing deposition of 15 $\mu$m plating copper. Then unnecessary copper was selectively etched away to form wiring conductors 122, and the through-holes 7 were filled with a resin. The resin used for filling the through-holes 7 was prepared in the following way.

To a 1-liter separable flask equipped with a cocked 25 ml determinate water receiver connected to a reflux condenser, a thermometer and a stirrer, 123.2 g (0.3 mol) of 2,2-bis-[4-(4-aminophenoxy)phenyl]propane, 115.3 g (0.6 mol) of trimellitic anhydride, both as diamines having 3 or more aromatic rings, and 716 g of NMP (N-methyl-2-pyrrolidone) as solvent were supplied and stirred at 80° C. for 30 minutes.

Then 143 g of toluene was supplied as an aromatic hydrocarbon capable of forming an azeotrope with water, followed by raising of temperature, and the mixture was refluxed at about 160° C. for 2 hours.

After confirming that about 10.8 ml of water was collected in the determinate water receiver, and that evaporation of water no longer took place, the temperature was raised to about 190° C. to remove toluene while also removing the distillate collected in the determinate water receiver.

Thereafter, the solution was returned to room temperature and 75.1 g (0.3 mol) of 4,4'-diphenylmethane diisocyanate was supplied as aromatic diisocyanate, allowing the reaction to proceed at 190° C. for 2 hours. An NMP solution of an aromatic polyamide-imide resin was obtained on conclusion of the reaction.

An epoxy resin and a phenolic resin were added as thermosetting component to said aromatic polyamide-imide resin and stirred at normal temperature for about one hour to prepare a resin composition.

After filling the through-holes, the resin was cured by an electric heat dryer at 160° C. for 60 minutes and the superfluous resin left on the substrate surface was removed by a belt sander abrasive machine T26MW (trade name, mfd. by Kikukawa Iron Works, Inc.) furnished with a #600 abrasive cloth.

Thereafter, a 50 μm thick nonwoven glass fabric-reinforced epoxy resin prepreg GEA-679NP (trade name, produced by Hitachi Chemical Company, Ltd.) and a 18 μm copper foil were placed one over another in that order and heated and pressed under the conditions of 170° C., 2.5 MPa and 90 minutes. Only the portions of the copper foil where the via-holes 71 were to be formed were etched away and exposed to laser to form the holes reaching the wiring conductors 122, and the laminate was immersed in an electroless plating solution L-59 (trade name, produced by Hitachi Chemical Company, Ltd.) at 70° C. for 8 hours, causing deposition of 18 implating copper. The unnecessary copper was selectively etched away, forming the wiring conductors 12 and via-holes 71, and a solder resist 61 was further formed by silk screen printing to make a substrate 8 for mounting a semiconductor chip.

On this substrate, there existed no wiring conductor left exposed to the surface near the boundary of the area where a semiconductor chip was to be mounted.

In this semiconductor chip mounting substrate 8, as shown in FIG. 5A, the opening 21 of the solder resist 61 was formed so that it would be equal to or larger than the contour 101 of the semiconductor chip.

Then, as shown in FIG. 5B, the bumps 4 were formed by plating on the terminal electrodes of the semiconductor chip 3, and further an anisotropic conductive adhesive Flip Tac (trade name, produced by Hitachi Chemical Company, Ltd.), designated 91, was applied between the semiconductor chip mounting substrate 8 and the semiconductor chip 3. Said semiconductor chip 3 was mounted with the upside down on the substrate 8 in registration with the connecting terminals 5 on the substrate and heated and pressed from above under the conditions of 180° C., 30 g/bump and 20 seconds to electrically connect the bumps 4 of the semiconductor chip 3 and the corresponding connecting terminals 5 of the substrate 8 through the medium of the anisotropic conductive adhesive 91.

In this way, the semiconductor chip 3 and its substrate 8 could be connected very easily and stably by a versatile method. Further, there was no defective formation of the solder resist 61 on the chip mounted surface of the substrate 8, and connection reliability after mounting of the semiconductor chip 3 was high. As for solder heat resistance of the through-holes, there was observed no formation of through-hole voids or separation from the substrate resin even after the chip-mounted substrate was floated in the molten solder of 260° C. for one minute.

EXAMPLE 2

Figure 6A:
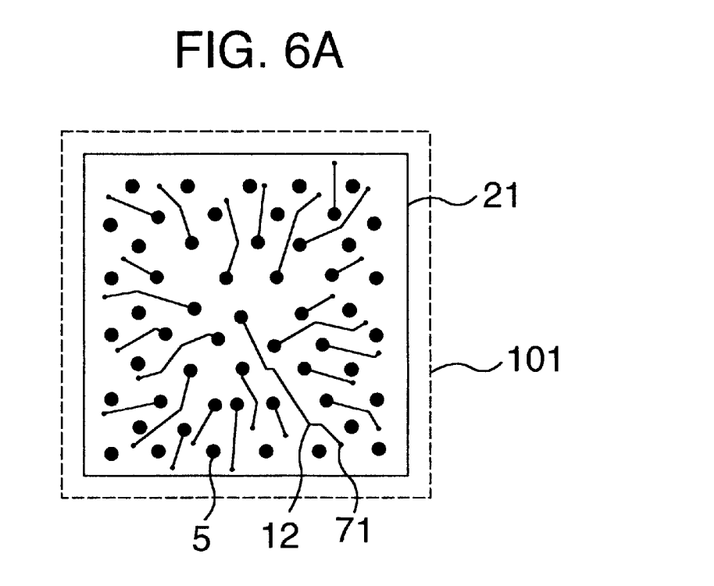
FIG. 6A is a top view showing the principal part of Example 2 of the present invention.

A semiconductor chip mounting substrate 8 was made in the same way as in Example 1, with the opening 21 of the solder resist 61 being formed smaller than the contour 101 of the semiconductor chip 3.

Figure 6B:
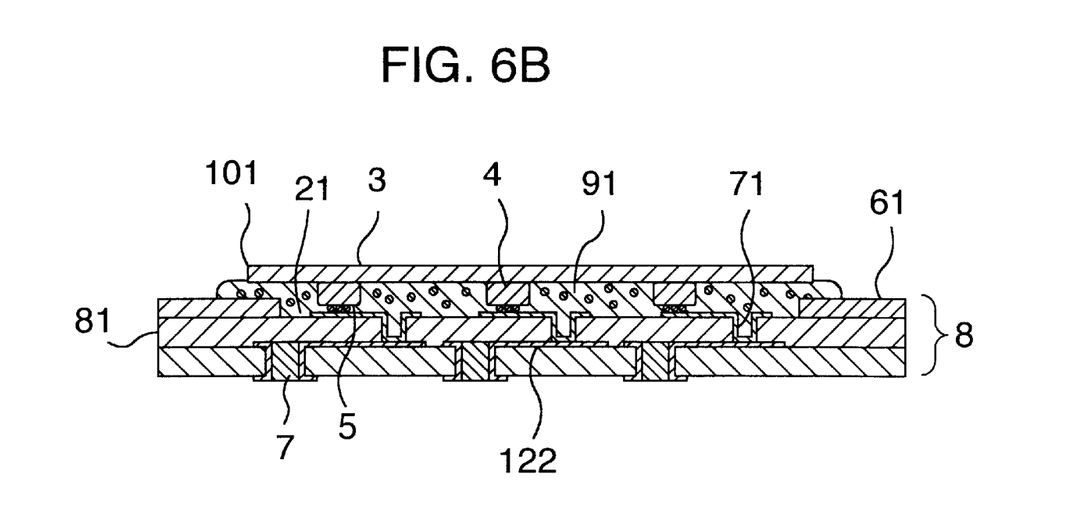
FIG. 6B is a sectional view of Example 2 of the present invention.

The ends of the gold wires were melted by a torch or other means to form gold balls, these balls were pressed against an electrode pad, and then the wires were cut out to provide the bumps 4 at the terminal electrodes of the semiconductor chip 3 as shown in FIG. 6B. Further, an anisotropic conductive adhesive Flip Tac (trade name, produced by Hitachi Chemical Company, Ltd.) 91 was disposed between the semiconductor chip mounting substrate 8 and a semiconductor chip 3, and said semiconductor chip 3 was mounted with the upside down on the substrate 8 in registration with the connecting terminals 5 on the substrate and heated and pressed from above under the conditions of 180° C., 30 g/bump and 20 seconds to electrically connect the bumps of the semiconductor chip 3 and the corresponding connecting terminals 5 of the substrate 8 through the medium of the conductive adhesive 91.

In this way, the semiconductor chip 3 and its mounting substrate 8 could be connected very easily and stably by a versatile method. Further, there was no defective formation of solder resist 61 on the chip mounted surface of the substrate 8, and the connection reliability after mounting of the semiconductor chip was high. Solder heat resistance of the through-holes was such that there was observed no formation of through-hole voids or separation from the substrate resin even after the chip mounted substrate was floated in the molten solver of 260° C. for one minute.

EXAMPLE 3

Figure 7A:
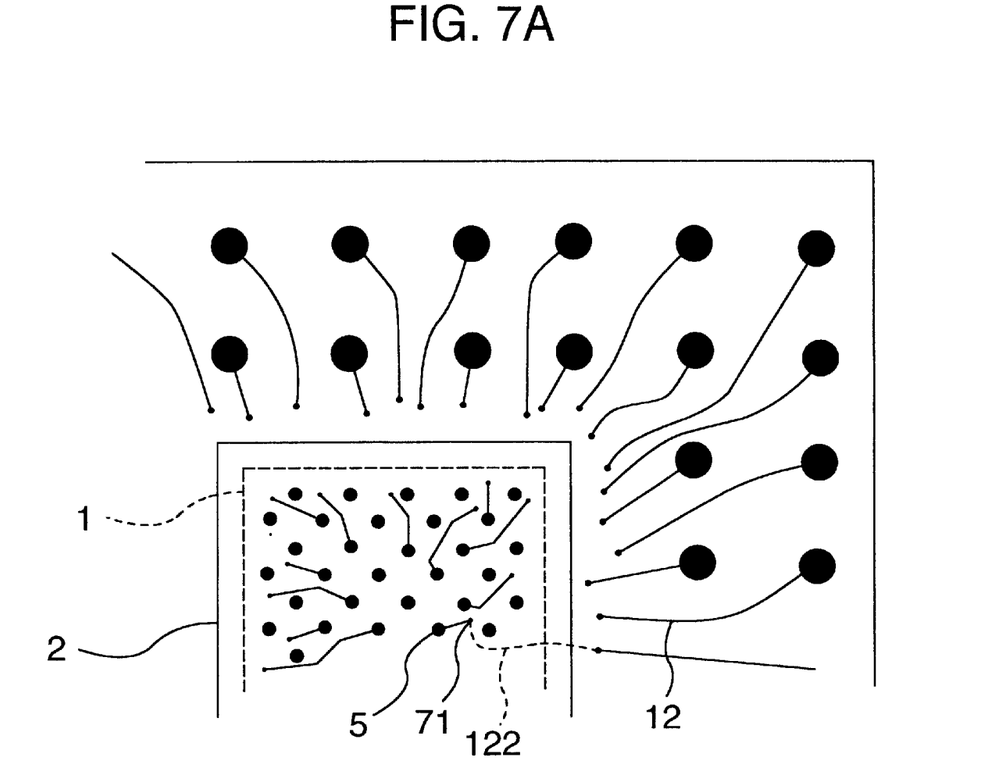
FIG. 7A is a top view showing the principal part of Example 3.

A semiconductor chip mounting substrate 8 was made in the same way as in Example 1, but as shown in FIG. 7A, the wiring conductors 12 on the substrate surface were not formed beneath the contour 1 of the chip, and the opening 21 of the solder resist 61 was formed 100 μm greater than the contour 1 of the semiconductor chip 3.

Figure 7B:
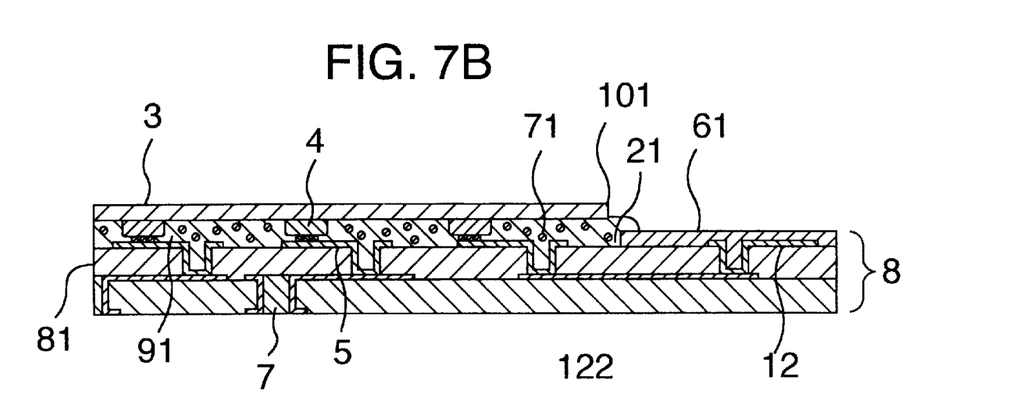
FIG. 7B is a sectional view showing Example 3 of the present invention.

As shown in FIG. 7B, bumps 4 were formed by plating on the terminal electrodes of the semiconductor chip 3, and further an anisotropic conductive adhesive Flip Tac (trade name, produced by Hitachi Chemical Company, Ltd.) 91 was disposed between the semiconductor chip mounting substrate 8 and a semiconductor chip 3. Said semiconductor chip 3 was mounted with the upside down on the substrate 8 in registration with the connecting terminals on the substrate and heated and pressed from above under the conditions of 180° C., 30 g/bump and 20 seconds to electrically connect the bumps 4 of the semiconductor chip 3 and the semiconductor chip mounting substrate 8 through the medium of the anisotropic conductive adhesive 91.

In this way, in Examples 1 to 3, the semiconductor chip 3 and its mounting substrate 8 could be connected very easily and stably by a versatile method. Further, there was no defective formation of solder resist 61 on the chip mounted surface of the substrate 8, and the connection reliability after mounting of the semiconductor chip was high. Also, solder heat resistance of the through-holes was such that there was observed no formation of through-hole voids or separation from the substrate resin even after the chip mounted substrate was floated in the molten solder of 260° C. for one minute.

EXAMPLE 4

A 0.8 mm thick single-sided copper-clad laminate MCL-E-679 (trade name, produced by Hitachi Chemical Company, Ltd.) having an 18 μm copper foil attached on one side, with the copper at the unnecessary parts being etched away, was prepared as a semiconductor chip mounting substrate 8.

Figure 8A:
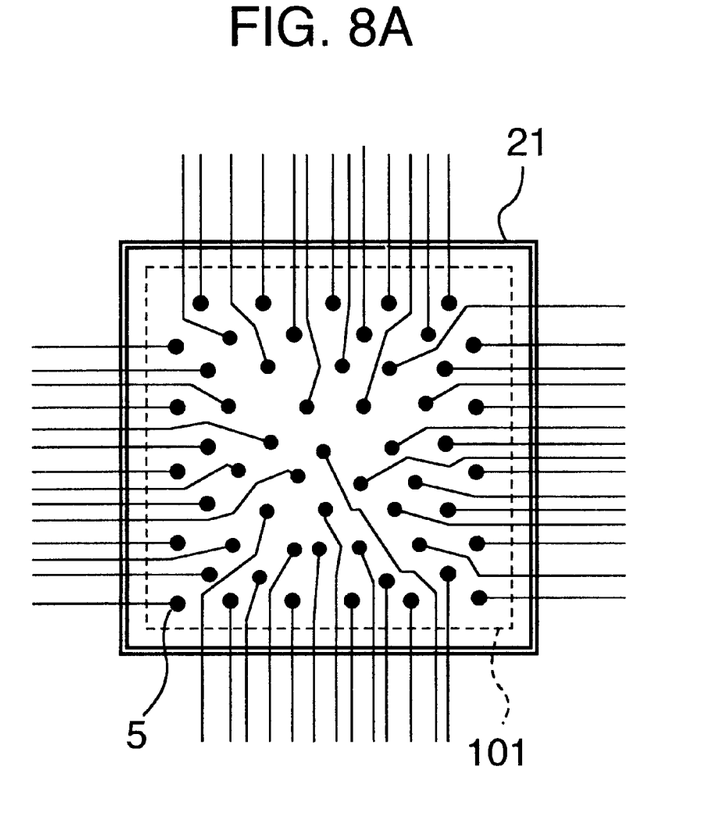
FIG. 8A is a top view showing the principal part of Example 4 of the present invention.

In this semiconductor chip mounting substrate 8, as shown in FIG. 8A, the opening 21 of the solder resist 61 was formed 150 μm greater than the contour 101 of the semiconductor chip 3.

Figure 8B:
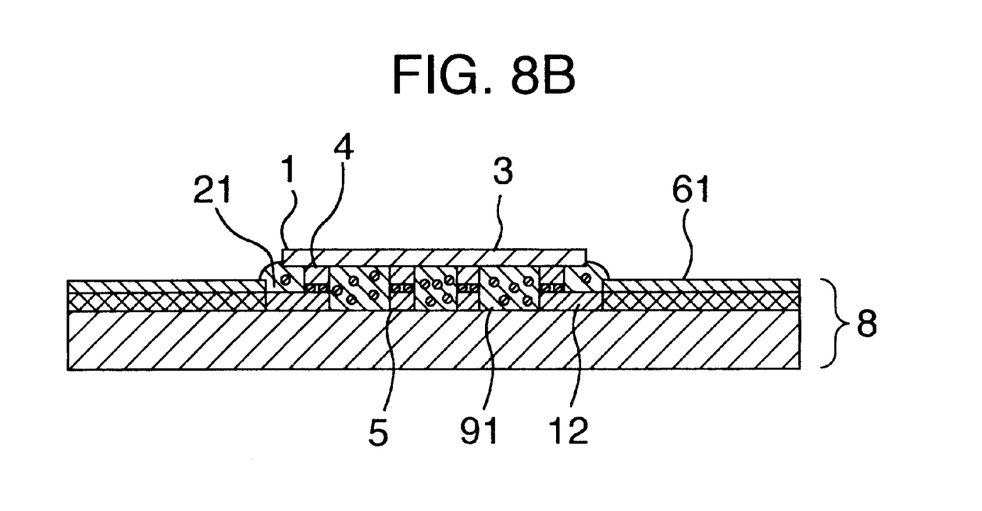
FIG. 8B is a sectional view showing Example 4 of the present invention.

As shown in FIG. 8B, bumps 4 are formed by plating at the terminals of the semiconductor chip 3, and an anisotropic conductive adhesive Flip Tac (trade name, produced by Hitachi Chemical Company, Ltd.) 91 was disposed between the semiconductor chip mounting substrate 8 and the semiconductor chip 3. Then the semiconductor chip 3 was mounted with the upside down on the substrate 8 by registering the bumps 4 with the corresponding connecting terminals 5 on the substrate 8, and heated and pressed from above under the conditions of 180° C., 30 g/bump and 20 seconds to electrically connect the bumps 4 of the semiconductor chip 3 and the connecting terminals 5 of the semiconductor chip mounting substrate 8 through the medium of the anisotropic conductive adhesive 91.

In this way, the semiconductor chip 3 and its mounting substrate 8 could be connected very easily and stably by a versatile method. Further, there was no defective formation of solder resist 61 on the semiconductor chip mounted side of the substrate 8, and connection reliability after mounting of the semiconductor chip 3 was high.

EXAMPLE 5

To form a build-up layer 81 of a structure such as shown in FIG. 7B on a semiconductor chip mounting substrate 8, a 50 μm thick nonwoven glass fabric-reinforced epoxy resin prepreg GEA-679NP (trade name, produced by Hitachi Chemical Company, Ltd.) and an 18 μm copper foil were placed in that order on an interlayer circuit board made by the same material and the same method as used for the semiconductor chip mounting substrate 8 in Example 4, and heated and pressed under the conditions of 170° C., 2.5 MPa and 90 minutes to form an integral laminate. Then the copper foil only at the parts where via-holes 71 were to be formed was etched away, and these parts were exposed to laser to form the holes reaching the wiring conductors 122. The laminate was then immersed in an electroless plating solution L-59 (trade name, produced by Hitachi Chemical Company, Ltd.) at 70° C. for 8 hours, causing deposition of 15 μm plating copper, and the unnecessary copper was selectively etched away to form the wiring conductors 12 and via-holes 71, thereby making a semiconductor chip mounting substrate 8 for a multilayer wiring board. The semiconductor chip 3 was mounted on this substrate 8 in otherwise the same way as in Example 4.

EXAMPLE 6

A semiconductor chip mounting substrate 8 was manufactured in the same way as in Example 5 except that an aramide fiber-reinforced epoxy resin prepreg EA-541 (trade name, produced by Shin-Kobe Electric Machinery Co., Ltd.) was used for the built-up layer 81, and a semiconductor chip 3 was mounted on this substrate 8 in the same way as in Example 5.

In any of these Examples 4 to 6, it suffices to form one opening 21 of solder resist 61 for each semiconductor chip. Such an opening can be easily formed and the substrate can be produced in a high yield, so that these Examples excel in productivity.

Also, in the step of connecting the semiconductor chip 3 and its mounting substrate 8, since the adhesive is allowed to flow when heated and pressed, generation of voids is inhibited and sealing with a resin is made possible to secure insulation between the connected parts, so that connection reliability between the semiconductor chip connecting terminals and the corresponding connecting terminals of the semiconductor chip mounting substrate is high.

Since the step of connecting the semiconductor chip 3 and its mounting substrate 8 and the step of sealing them with a resin can be accomplished simultaneously, the present invention is also typified by its excellent mass productivity in the mounting step.

Further, as the opening 21 of solder resist 61 is greater than the contour of the semiconductor chip 3, any superfluous adhesive, i. e. the adhesive other than needed for sealing can be let run out of the assembly, so that the residual stress in the connecting step is minimized and there scarcely takes place deformation.

Still further, in case of using an adhesive in which the conductive particles are dispersed, connection reliability can be elevated by heating and pressing the adhesive.

EXAMPLE 7

A 0.8 mm thick single-sided copper-clad laminate MCL-E-679 (trade name, produced by Hitachi Chemical Company, Ltd.) having an 18 μm copper foil attached on one side, with the copper at the unnecessary parts of the foil being etched away, was prepared as a semiconductor chip mounting substrate.

Figure 9A:
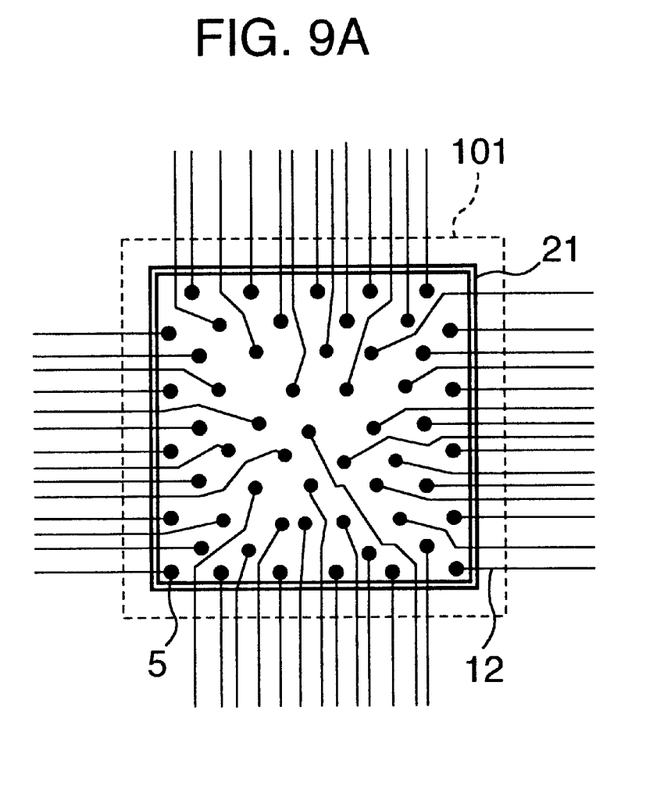
FIG. 9A is a top view showing the principal part of Example 7 of the present invention.

In this semiconductor chip mounting substrate 8, as shown in FIG. 9A, the opening 21 of the solder resist 61 was formed 150 mn smaller than the contour 101 of the semiconductor chip 3.

Figure 9B:
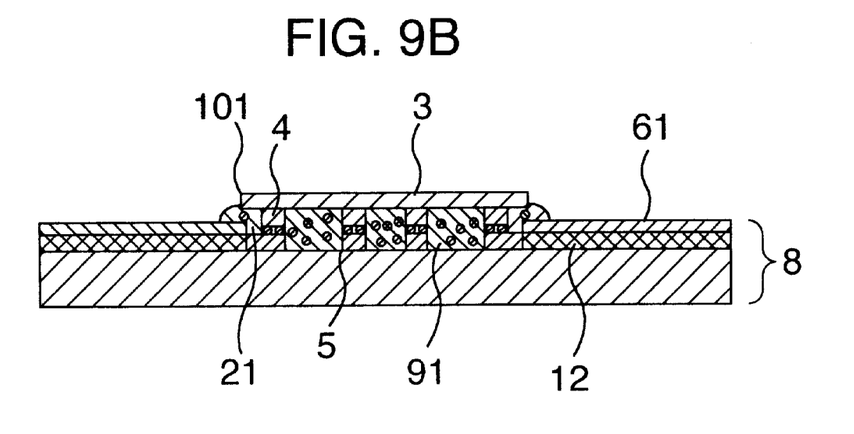
FIG. 9B is a sectional view showing Example 7 of the present invention.

Then, as shown in FIG. 9B, bumps 4 were formed by plating at the terminals of the semiconductor chip 3, and an anisotropic conductive adhesive Flip Tac (trade name, produced by Hitachi Chemical Company, Ltd.) 91 was disposed between the semiconductor chip 3 and its mounting substrate 8, after which the semiconductor chip 3 was mounted with the upside down on the substrate 8 by registering the bumps 4 with the corresponding connecting terminals on the substrate 8, and heated and pressed from above under the conditions of 180°C., 30 g/bump and 20 seconds to electrically connect the bumps 4 of the semiconductor chip 3 and the connecting terminals of the semiconductor chip mounting substrate 8 through the medium of the anisotropic conductive adhesive 91.

In this way, the semiconductor chip 3 and its mounting substrate 8 could be connected very easily and stably by a versatile method. Further, there was no defective formation of the solder resist 61 on the chip mounted side of the semiconductor chip mounting substrate, and the connection reliability after mounting of the semiconductor chip was high.

EXAMPLE 8

As the build-up layer 81 shown in FIG. 7B in a semiconductor chip mounting substrate, a 50 μm thick nonwoven glass fabric-reinforced epoxy resin prepreg GEA-679NP (trade name, produced by Hitachi Chemical Company, Ltd.) and an 18 μm copper foil were placed in that order on an interlayer circuit board made by the same material and the same method as used for the semiconductor chip mounting substrate in Example 7, and heated and pressed under the conditions of 170° C., 2.5 MPa and 90 minutes, producing a multilayer wiring board in otherwise the same way as in Example 7. Using this multilayer wiring board, a semiconductor chip 3 was mounted on the semiconductor chip mounting substrate 8 in the same way as in Example 7.

EXAMPLE 9

A multilayer wiring board was made in the same way as in Example 8 except that an aramide fiber-reinforced epoxy resin prepreg EAA-541 (trade name, produced by Shin-Kobe Electric Machinery Co., Ltd.) was used for the build-up layer 81, and using this multilayer wiring board, a semiconductor chip 3 was mounted on a semiconductor chip mounting substrate 8 by the same method as used in Example 8.

In any of these Examples 7 to 9, it suffices to form one opening 21 of the solder resist 61 for each semiconductor chip. Such an opening can be formed easily and the substrate can be produced in a high yield, so that these Examples excel in productivity.

Also, in the step of connecting the semiconductor chip 3 and its mounting substrate 8, since the adhesive is allowed to flow when heated and pressed, formation of voids is inhibited. Further, since the opening 21 of the solder resist 61 is smaller than the contour of the semiconductor chip 3, the adhesive is substantially inhibited from flowing other than the area where the bumps 4 of the semiconductor chip 3 and the connecting terminals 5 of the semiconductor chip mounting substrate 8 are connected, and also sealing can be effected with a resin, securing insulation between the connected parts, so that connection reliability between the connecting terminals of the semiconductor chip 3 and the corresponding connecting terminals 5 of substrate 8 is high. Since the step of connecting the semiconductor chip 3 and its mounting substrate 8 and the step of sealing them with a resin can be accomplished simultaneously, these Examples also excel in mass productivity in the mounting step.

Further, since the adhesive other than needed for sealing can be let out of the assembly if the film thickness is properly adjusted, residual stress in the connecting step is minimized and deformation scarcely takes place.

Moreover, in case of using an adhesive having the conductive particles dispersed therein, connection reliability can be elevated by heating and pressing the adhesive.

INDUSTRIAL APPLICABILITY

The semiconductor chip mounting substrate of the present invention is improved in connection reliability and can be produced with excellent mass productivity, so that it contributes greatly to the semiconductor chip industry.

What is claimed is:

1. A substrate for mounting a semiconductor chip having bumps with an adhesive, characterized in that at least connecting terminals for making connection to the bumps of the semiconductor chip are provided in the area of the substrate surface where the semiconductor chip is to be mounted, and wiring conductors are provided outside the area where the semiconductor chip is to be mounted, said wiring conductors being so disposed that they will not be exposed to the substrate surface near the boundary of the area where the semiconductor chip is to be mounted, wherein the wiring conductors are led out from the respective connecting terminals and laid beyond the boundary of the semiconductor chip mounting area, with an insulating coating of said wiring conductors being formed outside of the semiconductor chin mounting area and not formed in the semiconductor chip mounting area, and in order that the wiring conductors may not be exposed to the surface near the boundary of the semiconductor chip mounting area, the surface of the semiconductor chip mounting area near the boundary of the semiconductor chip mounting area is coated with an adhesive for fixing the semiconductor chip.

2. A semiconductor chip mounting substrate according to claim 1, wherein the insulating coating of the wiring conductors is provided to coat not only the wiring conductors at the boundary of the semiconductor chip mounting area but also outside of said area.

3. A semiconductor chip mounting substrate according to claim 1, wherein said adhesive is an anisotropic conductive adhesive.

4. A semiconductor chip mounting substrate according to claim 1, wherein the thickness of the insulating coating is 15 to 50 μm.

5. A semiconductor chip mounting substrate according to claim 4, wherein said adhesive is an anisotropic conductive adhesive.

6. A substrate for mounting a semiconductor chip having bumps with an adhesive, characterized in that at least connecting terminals for making connection to the bumps of the semiconductor chip are provided in the area of the substrate surface where the semiconductor chip is to be mounted, and wiring conductors are provided outside the area where the semiconductor chip is to be mounted, said wiring conductors being so disposed that they will not be exposed to the substrate surface near the boundary of the area where the semiconductor chip is to be mounted, wherein the wiring conductors are led out from respective connecting terminals and laid beyond the area of the semiconductor chip mounting area, and in order that the wiring conductors may not be exposed near the boundary of the semiconductor chip mounting area, an insulating coating of the wiring conductors is provided to coat not only the wiring conductors at the boundary of the semiconductor chip mounting area but also the outside of said area, the insulating coating being formed to the point of 20 to 300 μm inwards from the boundary of the semiconductor chip mounting area.

7. A semiconductor chip mounting substrate according to claim 6, wherein the thickness of the insulating coating is set so that a clearance will be formed infallibly between the semiconductor chip and the insulating coating when the semiconductor chip is mounted on its substrate after correct positioning without applying pressure to the chip.

8. A semiconductor chip mounting substrate according to any one of claims 4, 2 and 7, wherein the substrate comprises an interlayer circuit board, a build-up layer and an insulating coating having an opening for mounting a semiconductor chip.

9. A substrate having a semiconductor chip mounted thereon, obtained by mounting a semiconductor chip on a semiconductor chip mounting substrate set forth in any one of claims 4, 2 and 7.

* * * * *